United States Patent
Yamazaki et al.

(10) Patent No.: US 9,771,272 B2
(45) Date of Patent: *Sep. 26, 2017

(54) OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Setagaya (JP); Masahiro Takahashi, Atsugi (JP); Noboru Kimizuka, Warsaw (PL)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/180,695

(22) Filed: Jun. 13, 2016

(65) Prior Publication Data
US 2016/0297686 A1 Oct. 13, 2016

Related U.S. Application Data

(63) Continuation of application No. 14/677,131, filed on Apr. 2, 2015, now Pat. No. 9,391,146, which is a (Continued)

(30) Foreign Application Priority Data

Mar. 19, 2013 (JP) .................................. 2013-056952

(51) Int. Cl.
*H01L 29/26* (2006.01)
*C01G 15/00* (2006.01)
(Continued)

(52) U.S. Cl.
CPC ........... *C01G 15/00* (2013.01); *C01G 15/006* (2013.01); *H01L 29/04* (2013.01); *H01L 29/22* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

(Continued)

*Primary Examiner* — Jack Chen
(74) *Attorney, Agent, or Firm* — Robinson Intellectual Property Law Office; Eric J. Robinson

(57) ABSTRACT

To provide an oxide semiconductor with a novel structure. Such an oxide semiconductor is composed of an aggregation of a plurality of InGaZnO$_4$ crystals each of which is larger than or equal to 1 nm and smaller than or equal to 3 nm, and in the oxide semiconductor, the plurality of InGaZnO$_4$ crystals have no orientation. Alternatively, such an oxide semiconductor is such that a diffraction pattern like a halo pattern is observed by electron diffraction measurement performed by using an electron beam with a probe diameter larger than or equal to 300 nm, and that a diffraction pattern having a plurality of spots arranged circularly is observed by electron diffraction measurement performed by using an (Continued)

electron beam with a probe diameter larger than or equal to 1 nm and smaller than or equal to 30 nm.

9 Claims, 9 Drawing Sheets

Related U.S. Application Data continuation of application No. 14/208,661, filed on Mar. 13, 2014, now Pat. No. 9,153,650.

(51) Int. Cl.
  *H01L 29/22* (2006.01)
  *H01L 29/04* (2006.01)
  *H01L 29/24* (2006.01)
  *H01L 29/786* (2006.01)

(52) U.S. Cl.
  CPC ............. *H01L 29/24* (2013.01); *H01L 29/26* (2013.01); *H01L 29/7869* (2013.01); *C01P 2002/60* (2013.01); *C01P 2002/70* (2013.01); *C01P 2002/74* (2013.01); *C01P 2002/77* (2013.01); *C01P 2004/04* (2013.01); *C01P 2004/54* (2013.01); *C01P 2006/10* (2013.01); *C01P 2006/40* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,935,964 | B2 | 5/2011 | Kim et al. |
| 7,998,372 | B2 | 8/2011 | Yano et al. |
| 8,168,544 | B2 | 5/2012 | Chang |
| 8,207,756 | B2 | 6/2012 | Shionoiri et al. |
| 8,236,635 | B2 | 8/2012 | Suzawa et al. |
| 8,242,494 | B2 | 8/2012 | Suzawa et al. |
| 8,304,765 | B2 | 11/2012 | Yamazaki et al. |
| 8,309,961 | B2 | 11/2012 | Yamazaki et al. |
| 8,319,215 | B2 | 11/2012 | Yamazaki et al. |
| 8,343,799 | B2 | 1/2013 | Ito et al. |
| 8,748,886 | B2 | 6/2014 | Yamazaki et al. |
| 9,153,650 | B2 * | 10/2015 | Yamazaki ............... H01L 29/26 |
| 2001/0046027 | A1 | 11/2001 | Tai et al. |
| 2002/0000593 | A1 | 1/2002 | Nishiyama et al. |
| 2002/0028541 | A1 | 3/2002 | Lee et al. |
| 2002/0056838 | A1 | 5/2002 | Ogawa |
| 2002/0132454 | A1 | 9/2002 | Ohtsu et al. |
| 2003/0006373 | A1 | 1/2003 | Koguchi et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0067659 | A1 | 4/2004 | Black et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0154561 | A1 | 7/2007 | Takeda et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0008908 | A1 | 1/2008 | Ishiwata et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0099803 | A1 | 5/2008 | Li et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0180544 | A1 | 7/2008 | Drader et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0008638 | A1 | 1/2009 | Kang et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0278122 | A1 | 11/2009 | Hosono et al. |
| 2009/0280600 | A1 | 11/2009 | Hosono et al. |
| 2010/0051938 | A1 | 3/2010 | Hayashi et al. |
| 2010/0051949 | A1 | 3/2010 | Yamazaki et al. |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072467 | A1 | 3/2010 | Yamazaki et al. |
| 2010/0084650 | A1 | 4/2010 | Yamazaki et al. |
| 2010/0092800 | A1 | 4/2010 | Itagaki et al. |

(56) References Cited

U.S. PATENT DOCUMENTS

| | | |
|---|---|---|
| 2010/0102312 A1 | 4/2010 | Yamazaki et al. |
| 2010/0105163 A1 | 4/2010 | Ito et al. |
| 2010/0108502 A1 | 5/2010 | Inoue et al. |
| 2010/0109002 A1 | 5/2010 | Itagaki et al. |
| 2010/0117075 A1 | 5/2010 | Akimoto et al. |
| 2010/0123130 A1 | 5/2010 | Akimoto et al. |
| 2010/0123136 A1 | 5/2010 | Lee et al. |
| 2010/0193782 A1 | 8/2010 | Sakata |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0084266 A1 | 4/2011 | Yamazaki et al. |
| 2011/0117698 A1 | 5/2011 | Suzawa et al. |
| 2012/0037901 A1 | 2/2012 | Mori et al. |
| 2012/0064703 A1 | 3/2012 | Jintyou et al. |
| 2012/0138922 A1 | 6/2012 | Yamazaki et al. |
| 2012/0184066 A1 | 7/2012 | Yano et al. |
| 2012/0211745 A1 | 8/2012 | Ueda et al. |
| 2012/0267624 A1 | 10/2012 | Isobe et al. |
| 2012/0276694 A1 | 11/2012 | Koezuka et al. |
| 2013/0009220 A1 | 1/2013 | Yamazaki et al. |
| 2013/0075723 A1 | 3/2013 | Yamazaki et al. |
| 2013/0082337 A1 | 4/2013 | Chudzik et al. |
| 2013/0087782 A1 | 4/2013 | Yamazaki et al. |
| 2013/0092924 A1 | 4/2013 | Sasagawa et al. |
| 2013/0092929 A1 | 4/2013 | Okazaki et al. |
| 2013/0099229 A1 | 4/2013 | Wakana et al. |
| 2013/0214273 A1 | 8/2013 | Yamazaki et al. |
| 2013/0221351 A1 | 8/2013 | Ebata et al. |
| 2013/0298989 A1 | 11/2013 | Tomizawa et al. |
| 2013/0341180 A1 | 12/2013 | Yamazaki |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0045299 A1 | 2/2014 | Yamazaki |
| 2014/0102877 A1 | 4/2014 | Yamazaki |
| 2014/0103339 A1 | 4/2014 | Yamazaki et al. |
| 2014/0124776 A1 | 5/2014 | Takahashi et al. |
| 2014/0145183 A1 | 5/2014 | Yamazaki |
| 2014/0151687 A1 | 6/2014 | Yamazaki |
| 2014/0175435 A1 | 6/2014 | Yamazaki et al. |
| 2014/0183527 A1 | 7/2014 | Yamazaki et al. |
| 2014/0183530 A1 | 7/2014 | Yamazaki et al. |
| 2014/0203276 A1 | 7/2014 | Yamazaki et al. |
| 2014/0225104 A1 | 8/2014 | Yamazaki et al. |
| 2014/0284596 A1 | 9/2014 | Yamazaki et al. |
| 2014/0306219 A1 | 10/2014 | Yamazaki et al. |
| 2014/0333864 A1 | 11/2014 | Miyake et al. |
| 2014/0346500 A1 | 11/2014 | Yamazaki |
| 2015/0021593 A1 | 1/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2006-261483 A | 9/2006 |
| JP | 2010-058135 A | 3/2010 |
| JP | 2012-144431 A | 8/2012 |
| JP | 2013-038401 A | 2/2013 |
| JP | 2013-093561 A | 5/2013 |
| WO | WO-2004/114391 | 12/2004 |
| WO | WO-2007/058231 | 5/2007 |
| WO | WO-2013/054823 | 4/2013 |

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Yamazaki.S et al., "Research, Development, and Application of Crystalline Oxide Semiconductor", SID Digest '12 : SID International Symposium Digest of Technical Papers, Jun. 5, 2012, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Apr. 1, 2014, vol. 53, No. 4, pp. 04ED18-1-04ED18-10.

Matteucci.G et al., "An experiment on the particle-wave nature of electrons", Eur. J. Phys (European Journal of Physics), 2009, vol. 30, pp. 217-226.

\* cited by examiner vertical axis: diffraction intensity [a. u.]
horizontal axis: magnitude of scattering vector | q | [nm⁻¹]

InGaZnO$_4$ crystal density:6.4g/cm$^3$
number of total atoms:166 cell length
a : 0.3295nm
b : 0.3295nm
c : 2.607nm
$\alpha$: 90°  $\beta$: 90°  $\gamma$: 120°

InGaZnO$_4$ amorphous density:6.1g/cm$^3$
number of total atoms:1344 cell length
a : 2.67577nm
b : 2.31729nm
c : 2.64627nm
$\alpha$: 90°  $\beta$: 90°  $\gamma$: 90°

OXIDE SEMICONDUCTOR

BACKGROUND OF THE INVENTION

1. Field of the Invention

The present invention relates to an oxide semiconductor.

2. Description of the Related Art

The research on a structure of In—Ga—Zn oxide started with the synthesis of the
In—Ga—Zn oxide by Kimizuka, Nakamura, et al. from National Institute for Research in Inorganic Materials. They reported that an In—Ga—Zn oxide had a homologous structure and was represented by a composition formula, $InGaO_3(ZnO)_m$ (m is a natural number) (see Patent Document 1 to Patent Document 6, and Non-Patent Document 1 to Non-Patent Document 4).

After that, a report about a transistor including amorphous In—Ga—Zn oxide was released (see Non-Patent Document 5). Since then, various research institutions and companies have actively researched and developed applied technology of In—Ga—Zn oxide.

Patent Documents

[Patent Document 1] Japanese Published Patent Application No. S63-210022
[Patent Document 2] Japanese Published Patent Application No. S63-210023
[Patent Document 3] Japanese Published Patent Application No. S63-210024
[Patent Document 4] Japanese Published Patent Application No. S63-215519
[Patent Document 5] Japanese Published Patent Application No. S63-239117
[Patent Document 6] Japanese Published Patent Application No. S63-265818

Non-Patent Documents

[Non-Patent Document 1] N. Kimizuka, and T. Mohri, *J. Solid State Chem.*, vol. 60, 1985, pp. 382-384
[Non-Patent Document 2] N. Kimizuka, et al., *J. Solid State Chem.*, vol. 116, 1995, pp. 170-178
[Non-Patent Document 3] M. Nakamura, *NIRIM NEWSLETTER*, vol. 150, 1995, pp. 1-4
[Non-Patent Document 4] M. Nakamura, et al., *J. Solid State Chem.*, vol. 93, 1991, pp. 298-315
[Non-Patent Document 5] K. Nomura, et al., *Nature*, vol. 432, 2004, pp. 488-492

SUMMARY OF THE INVENTION

An object is to provide an oxide semiconductor with a novel structure.

An oxide semiconductor according to one embodiment of the present invention is composed of aggregation of a plurality of crystals of $InGaZnO_4$ (also referred to as $InGaZnO_4$ crystals) each of which is larger than or equal to 1 nm and smaller than or equal to 3 nm The plurality of $InGaZnO_4$ crystals have no orientation.

Further, an oxide semiconductor according to one embodiment of the present invention shows a diffraction pattern, like a halo pattern (diffraction pattern having no spot), that is observed when the oxide semiconductor is subjected to selected-area electron diffraction measurement with a probe diameter setting to larger than or equal to 300 nm. The oxide semiconductor shows a diffraction pattern having a plurality of spots circularly arranged when the oxide semiconductor is observed by electron diffraction measurement with a probe diameter setting to larger than or equal to 1 nm and smaller than or equal to 30 nm.

An oxide semiconductor having the following structure is referred to as a nanocrystalline oxide semiconductor (nc-OS). It is composed of aggregation of a plurality of crystals each of which is larger than or equal to 1 nm and smaller than or equal to 3 nm (the crystal is also referred to as nanocrystal (nc)), and the plurality of crystals have no orientation.

Although an nc-OS is sometimes difficult to distinguish from an amorphous oxide semiconductor, the nc-OS has characteristics described below and thus can be regarded as an oxide semiconductor having a novel structure.

Just for reference, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In an image obtained with a transmission electron microscope (TEM) (also referred to as a TEM image), a crystal part in the amorphous oxide semiconductor cannot be found.

When the amorphous oxide semiconductor is subjected to structural analysis by an out-of-plane method with an XRD apparatus, a peak which shows a crystal plane does not appear. A halo pattern is observed in an electron diffraction pattern of the amorphous oxide semiconductor.

The amorphous oxide semiconductor contains impurities such as hydrogen at a high concentration. In addition, the amorphous oxide semiconductor is an oxide semiconductor with a high density of defect states.

The oxide semiconductor having a high impurity concentration and a high density of defect states has many carrier traps or many carrier generation sources.

Next, an nc-OS is described.

The nc-OS has a periodic atomic order in a microscopic region. Note that there is no regularity of crystal orientation between different crystal parts in the nc-OS. Accordingly, there is no orientation on the whole nc-OS. Thus, in some cases, the nc-OS cannot be distinguished from an amorphous oxide semiconductor depending on an analysis method. For example, in a TEM image of the nc-OS, a crystal cannot occasionally be observed clearly, which is similar to the case of an amorphous oxide semiconductor. Further, in a TEM image of the nc-OS, a boundary between crystals, i.e., grain boundary, cannot be clearly observed occasionally. Furthermore, when the nc-OS is subjected to structural analysis by an out-of-plane method with an XRD apparatus using an X-ray having a larger diameter than a diameter of a crystal part, a peak indicating a crystal plane does not appear, which is similar to the case of an amorphous oxide semiconductor.

When the nc-OS is subjected to electron diffraction measurement using an electron beam with a probe diameter (e.g., 50 nm or larger) larger than a diameter of a crystal part, a halo pattern is occasionally observed. Meanwhile, when electron diffraction measurement is performed on the nc-OS by using an electron beam with a probe diameter (e.g., larger than or equal to 1 nm and smaller than or equal to 30 nm) that is almost equivalent to or smaller than a diameter of a crystal part (the diffraction measurement is also referred to as nanobeam electron diffraction measurement), spots can be observed. Further, in a nanobeam electron diffraction pattern of the nc-OS, a region with high luminance in a circular (ring) shape is shown in some cases. Also in a nanobeam electron diffraction pattern of the nc-OS, a plurality of spots are observed in a ring-like region in some cases.

Thus, the nc-OS is an oxide semiconductor that has high regularity as compared to an amorphous oxide semiconductor. Therefore, the nc-OS is likely to have a lower density of defect states than an amorphous oxide semiconductor.

An object is to provide an oxide semiconductor with a novel structure that can be used for a transistor or the like.

DETAILED DESCRIPTION OF THE INVENTION

Embodiments of the present invention will be described below in detail with reference to drawings.

Figure 1A:
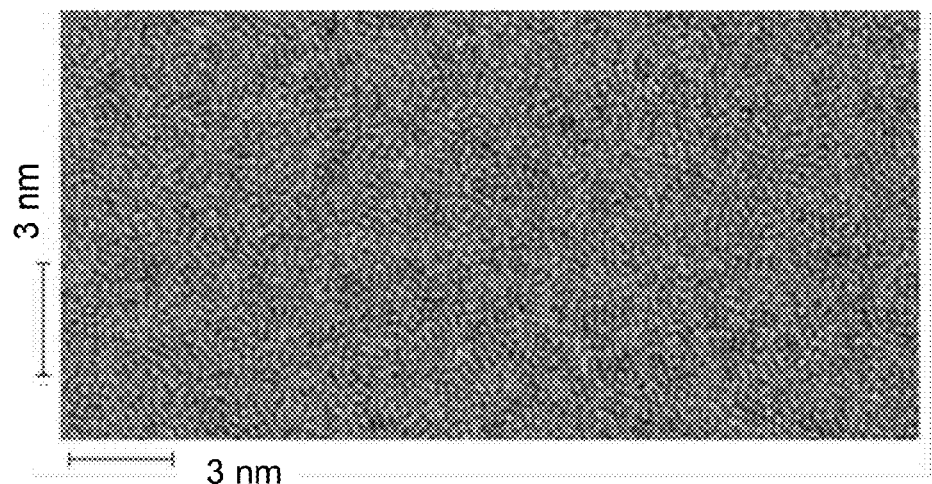
FIGS. 1A and 1B show a planar TEM image and electron diffraction patterns of an In—Ga—Zn oxide including nanocrystal.

FIG. 1A is a TEM image of an In—Ga—Zn oxide including nanocrystal, as an example of an nc-OS, observed from a planar surface side (the image is also referred to as planar TEM image).

The TEM image was observed with use of a Hitachi H-9000NAR transmission electron microscope by setting the accelerating voltage to 300 kV and the camera length to 500 mm As a shooting medium, a film was used.

It is difficult to clearly observe crystallinity of the In—Ga—Zn oxide including nanocrystal (also referred to as nanocrystalline In—Ga—Zn oxide) in FIG. 1A.

Figure 1B:
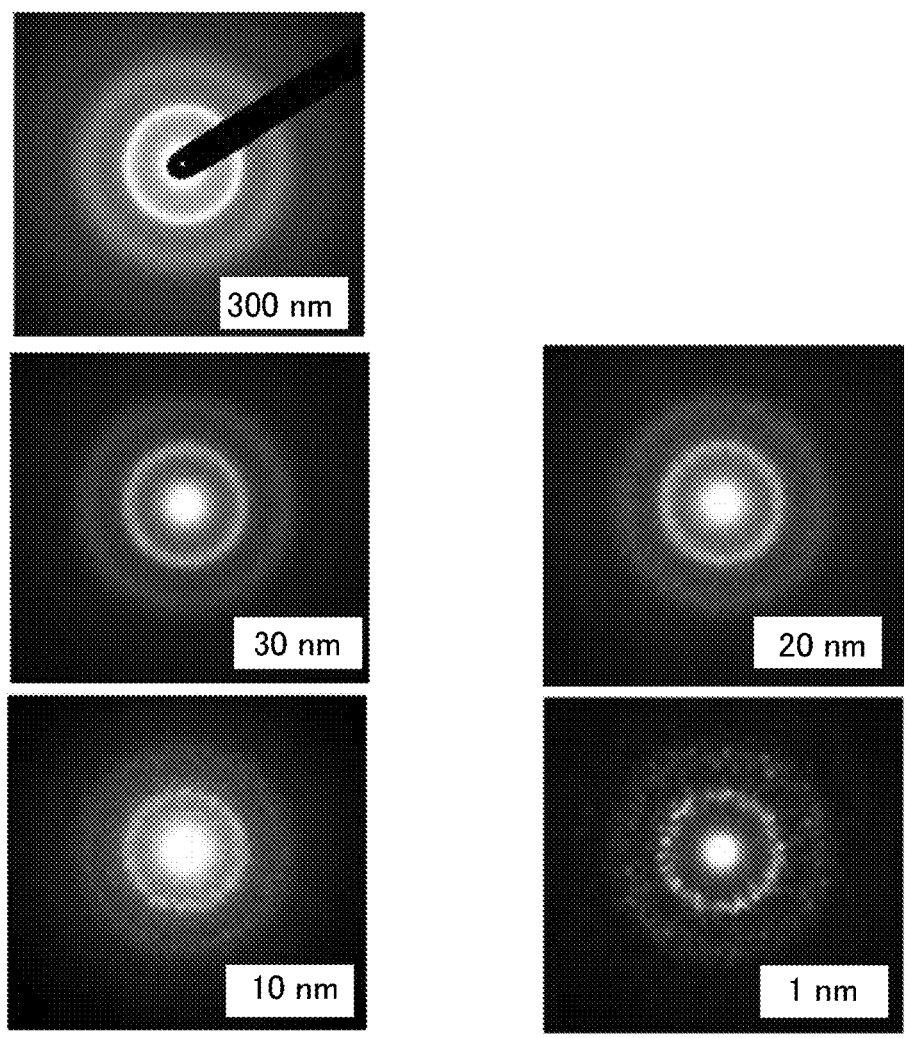

FIG. 1B shows electron diffraction patterns. One of them is an electron diffraction pattern which was observed when an electron beam with a probe diameter of 300 nm was incident on a cross section of Sample A that was the nanocrystalline In—Ga—Zn oxide thinned to approximately 50 nm (such electron diffraction is also referred to as selected area electron diffraction (SAED)). The other electron diffraction patterns were obtained by measuring nanobeam electron diffraction patterns of Sample A under conditions where probe diameters of electron beams were 30 nm, 20 nm, 10 nm, and 1 nm.

For measurement of selected area electron diffraction, a Hitachi H-9000NAR transmission electron microscope was used under conditions where the accelerating voltage was 300 kV and the camera length was 500 mm. Further, for measurement of nanobeam electron diffraction, a Hitachi HF-2000 field-emission transmission electron microscope was used under conditions where the accelerating voltage was 200 kV and the camera length was 400 mm. As a shooting medium, a film was used.

According to FIG. 1B, in the case of the selected area electron diffraction (probe diameter of 300 nm) of Sample A, a spot is not clearly observed, and an electron diffraction pattern like a blur halo pattern is observed. On the other hand, in the case of the nanobeam electron diffraction (probe diameters of 30 nm, 20 nm, 10 nm, and 1 nm) of Sample A, electron diffraction patterns having spots are observed. The number of spots is increased as the probe diameter is reduced.

Figure 2:
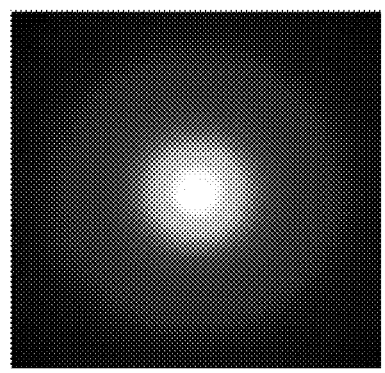
FIG. 2 shows a nanobeam electron diffraction pattern of a quartz substrate.

For comparison, nanobeam electron diffraction of quartz in an amorphous state was observed using a nanobeam with a probe diameter of 1 nm As a result, an electron diffraction pattern that is a halo pattern shown in FIG. 2 was observed. Thus, the fact of the electron diffraction pattern having spots observed by the nanobeam electron diffraction measurement is one of proofs that Sample A is an aggregation of nanocrystals.

Figure 3:
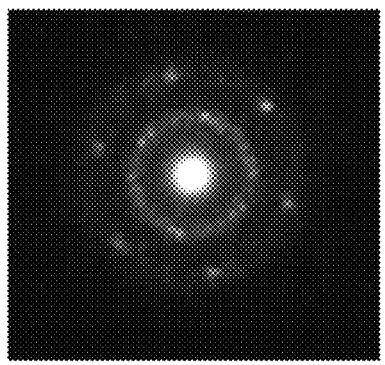
FIG. 3 shows nanobeam electron diffraction patterns of an In—Ga—Zn oxide including nanocrystal.
Figure 3:
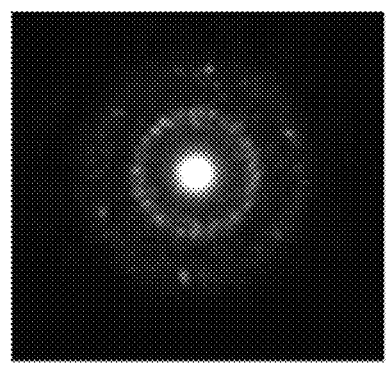
Figure 3:
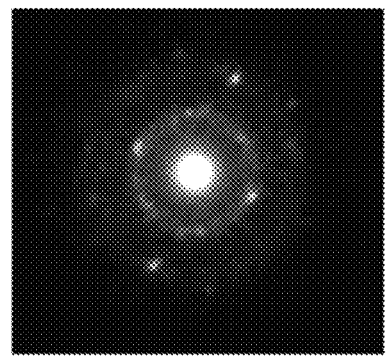
Figure 3:
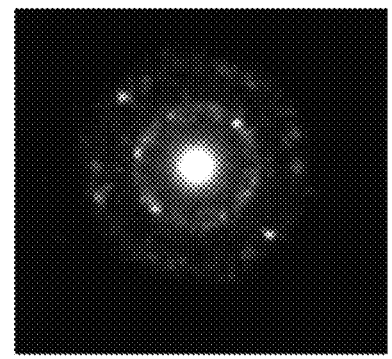

Furthermore, for more detailed structural analysis, nanobeam electron diffraction was measured in the following manner: an electron beam with a probe diameter of 1 nm was incident on a cross section of Sample B of a nanocrystalline In—Ga—Zn oxide thinned to several nanometers (approximately 5 nm or less). As a result, electron diffraction patterns having spots which indicate crystallinity and are shown in FIG. 3 were observed in four different portions. Note that as a shooting medium, films were used.

According to FIG. 3, diffraction patterns showing crystallinity were obtained from Sample B, but orientation along a crystal plane in a specific direction was not observed.

As described above, though an nc-OS is not distinguished from an amorphous oxide semiconductor in some cases depending on an analysis method, an exact analysis makes it possible to distinguish the nc-OS and the amorphous oxide semiconductor. Further, it is found that a microscopic region in the nc-OS has a periodic atomic order. Thus, the nc-OS is an oxide semiconductor that has high regularity as compared to an amorphous oxide semiconductor. Therefore, the nc-OS is likely to have a lower density of defect states than an amorphous oxide semiconductor.

EXAMPLE 1

In this example, detailed structural analysis of an In—Ga—Zn oxide was conducted with calculation.

First, a nanobeam electron diffraction pattern of a nanocrystalline In—Ga—Zn oxide was obtained.

Figure 4A:
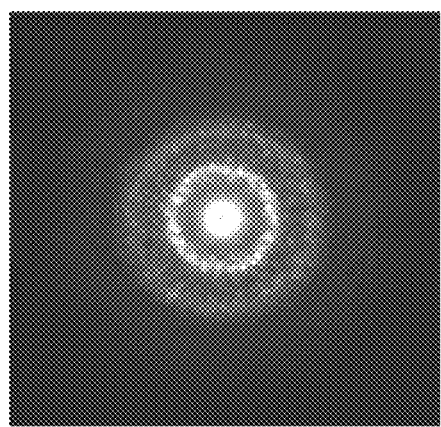
FIGS. 4A to 4C show structural analysis results of an In—Ga—Zn oxide including nanocrystal.

FIG. 4A shows an electron diffraction pattern that was obtained in the following manner: an electron beam with a probe diameter of 1 nm was incident on a cross section of Sample 1 of a nanocrystalline In—Ga—Zn oxide thinned to approximately 50 nm. Note that as a shooting medium, an imaging plate was used.

Figure 4B:
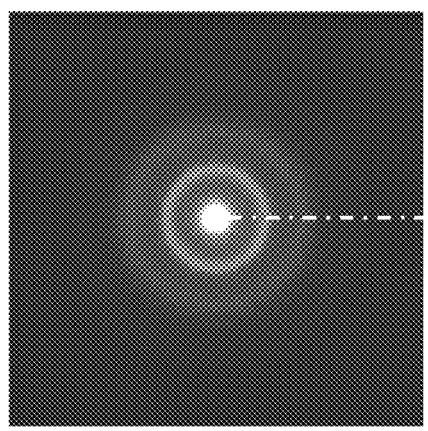
Figure 4C:
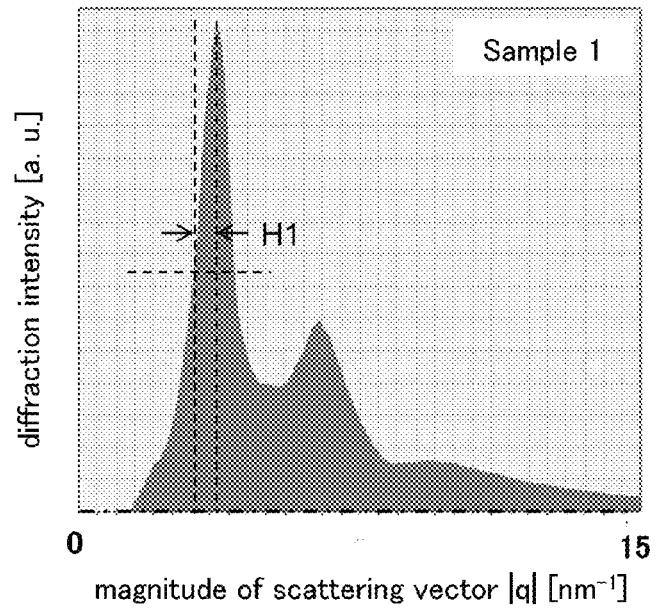

FIG. 4B shows an electron diffraction pattern that was averaged in the uniform magnitude of a scattering vector |q| rotating the electron diffraction pattern shown in FIG. 4A with a center of the pattern as an axis. FIG. 4C is a graph showing an electron diffraction luminance profile along a dashed-dotted line shown in FIG. 4B, where the horizontal axis indicates the magnitude of scattering vector $|q|[nm^{-1}]$, and the vertical axis indicates the diffraction intensity [arbitrary unit]. Note that in FIG. 4C, a transmitted wave in the vicinity of the center in FIG. 4B is not taken into consideration for easy understanding.

Figure 5:
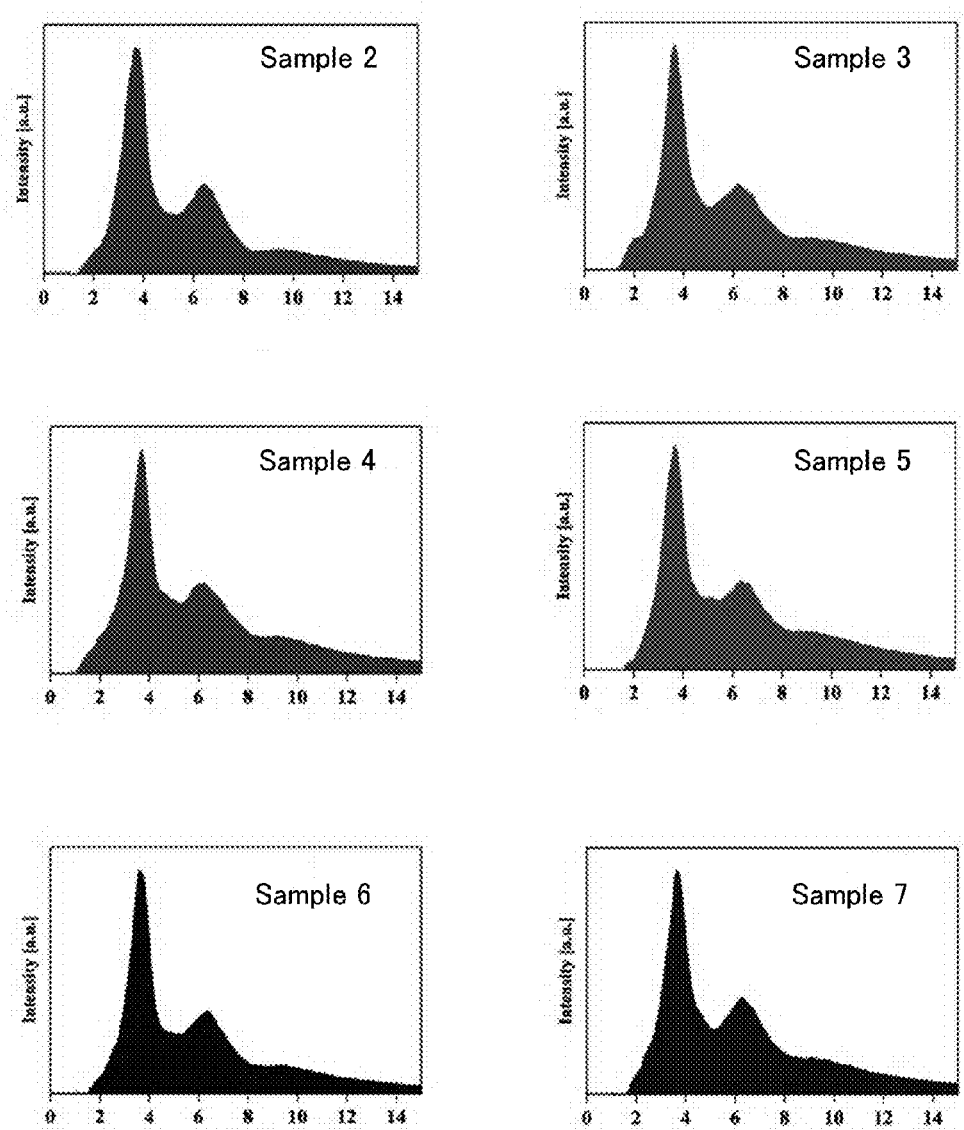
FIG. 5 shows structural analysis results of In—Ga—Zn oxides including nanocrystal.

In addition, a nanobeam with a probe diameter of 1 nm was incident on cross sections of Sample 2 to Sample 7 each of which was a nanocrystalline In—Ga—Zn oxide thinned to approximately 50 nm, whereby nanobeam electron diffraction patterns were obtained. Then, the obtained electron diffraction patterns were averaged in the uniform magnitude of a scattering vector |q| by rotating the diffraction patterns with centers thereof as an axis. Profiles of electron diffraction luminance are shown in graphs where the horizontal axes indicate the magnitude of scattering vector $|q|[\text{nm}^{-1}]$ and the vertical axes indicate the diffraction intensity [arbitrary unit] (see FIG. 5), like the case of Sample 1.

Next, as for $InGaZnO_4$ in a crystal state (crystalline $InGaZnO_4$) and $InGaZnO_4$ in an amorphous state (amorphous $InGaZnO_4$), calculation was performed. Then, graphs showing the calculation results of crystalline $InGaZnO_4$ and amorphous $InGaZnO_4$ were made (see FIG. 7 and FIG. 8). In the graphs, the horizontal axes indicate the magnitude of scattering vector $|q|[\text{nm}^{-1}]$ and the vertical axes indicate the diffraction intensity [arbitrary unit].

For the calculation, TEM simulation software jems was used. The calculation mode was set to a mode for calculating powder patterns, and as the fitting function, Gaussian function was used. As the calculation conditions, the accelerating voltage was set to 200 kV, and the camera length was set to 400 mm.

Figure 6:
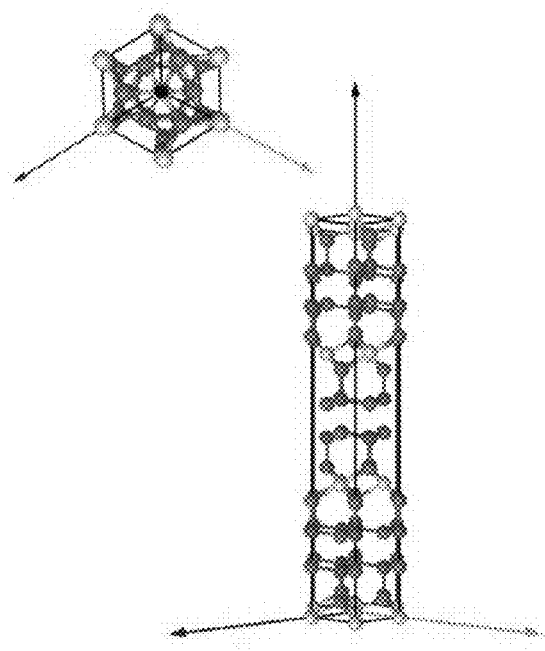
FIG. 6 shows structural models used for calculation.
Figure 6:
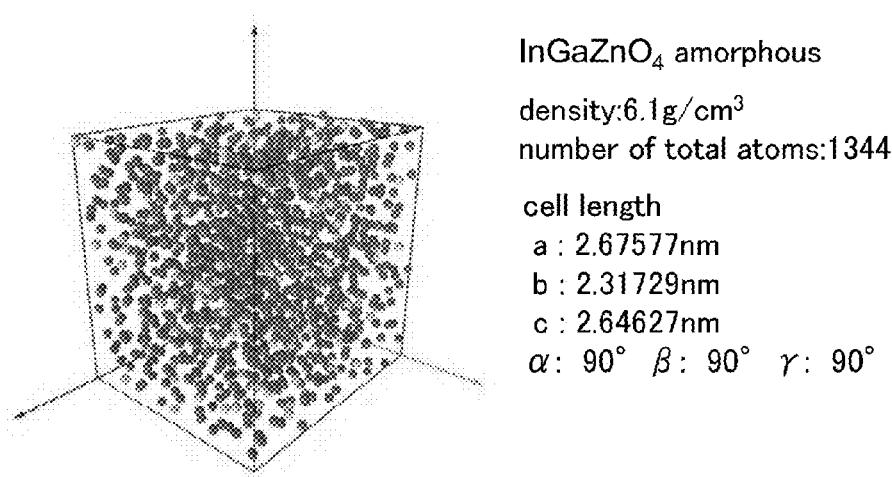

For the calculation, $InGaZnO_4$ structure models shown in FIG. 6 were used. Note that the structure model of crystalline $InGaZnO_4$ was obtained from Inorganic Material Database of National Institute for Materials Science (AtomWork, http://crystdb.nims.go.jp). The structure model of amorphous $InGaZnO_4$ was made by a melt-quench method in classical molecular dynamics calculation. As software for the classical molecular dynamics calculation, "SCIGRESS ME 2.0" was used, and for potential, Born-Mayer-Huggins potential was used.

In the calculation, structure factors in each plane (hkl) of the structure models were determined, and the diffraction position and the diffraction intensity were calculated. A shape of a diffraction peak of each plane (hkl) was calculated by fitting using Gaussian function. Note that the sample shape was isotropic powder. The powder size generally relates to the half width at half maximum (HWHM) of the diffraction peak.

Figure 7:
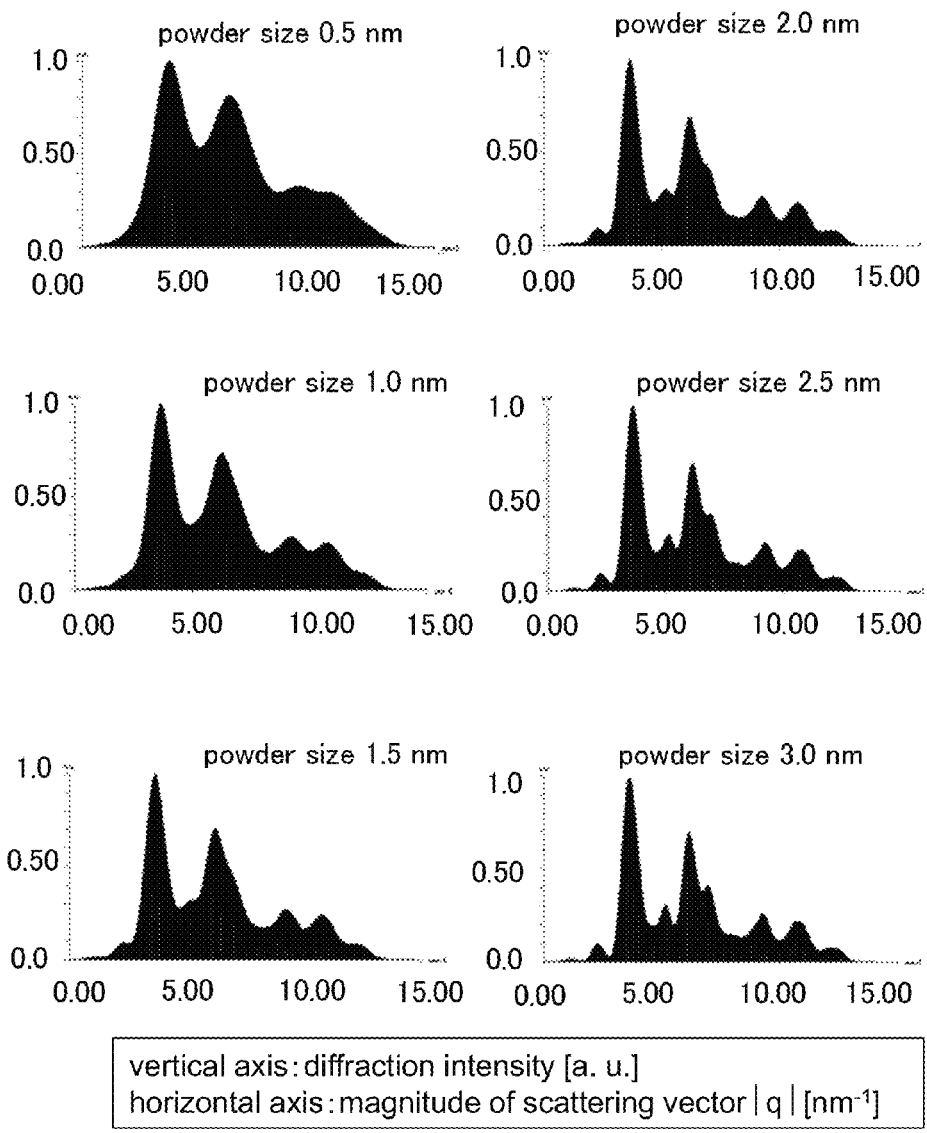
FIG. 7 shows structural analysis results obtained by calculation of crystalline $InGaZnO_4$.

FIG. 7 shows profiles of electron diffraction luminance of crystalline $InGaZnO_4$, which were obtained by the calculation. According to FIG. 7, besides a first peak, a plurality of peaks are observed in crystalline $InGaZnO_4$. In addition, as the powder size is increased, the width of the first peak becomes narrow.

Figure 8:
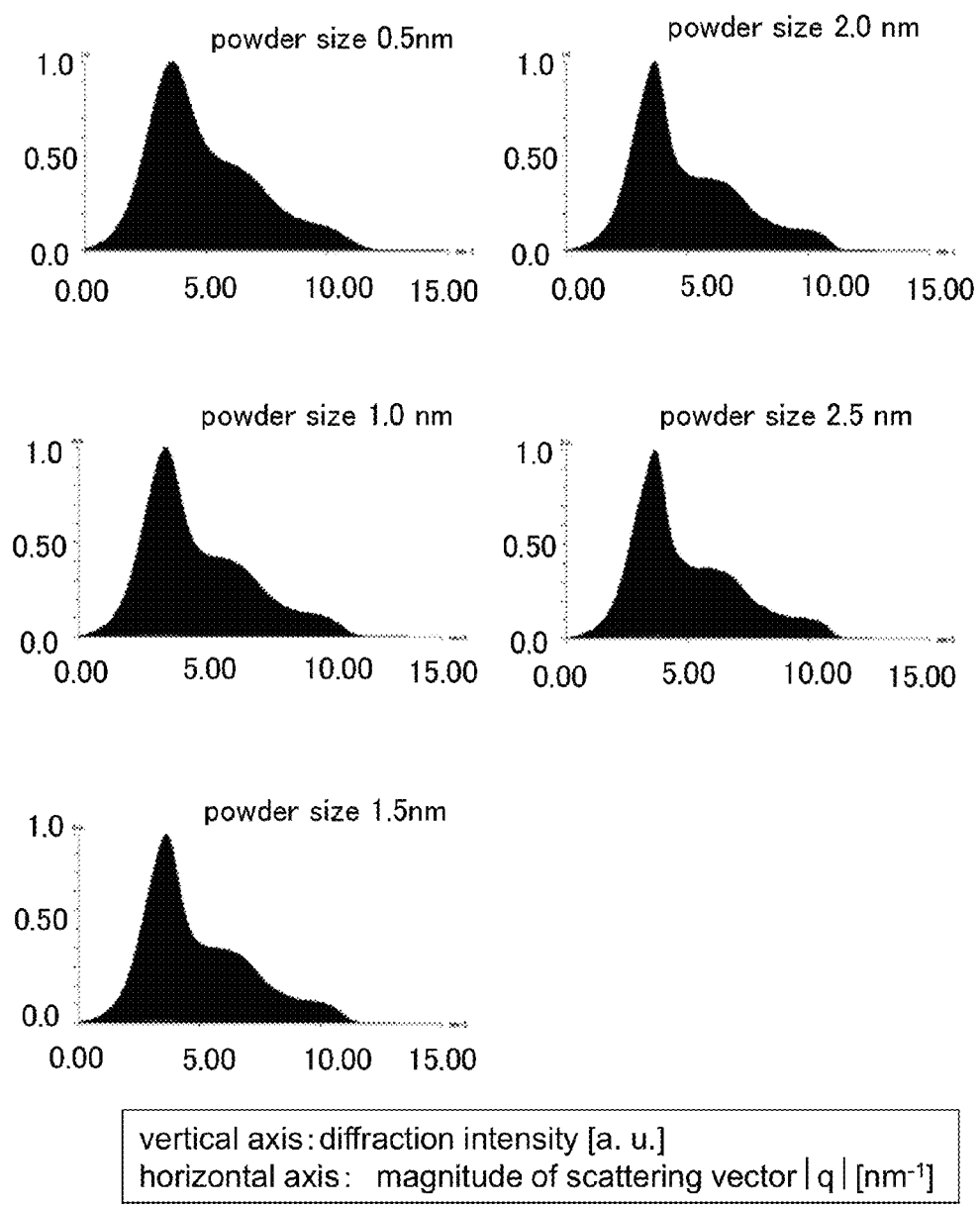
FIG. 8 shows structural analysis results obtained by calculation of amorphous $InGaZnO_4$.

FIG. 8 shows profiles of electron diffraction luminance of amorphous $InGaZnO_4$, which were obtained by the calculation. According to FIG. 8, only a first peak is clearly observed, and it was difficult to distinguish another peak from the other parts of profile. Note that the case where the powder size is larger than 3.0 nm is not shown because the powder is larger than a cell size of the model.

Next, the half widths at half maximum of the first peaks (H1) obtained from the calculation results of the crystalline $InGaZnO_4$ and amorphous $InGaZnO_4$ and the half widths at half maximum of the actual measured first peaks (H1) of samples of nanocrystalline In—Ga—Zn oxides (Sample 1 to Sample 7) were compared. The comparison results are shown in FIG. 9.

Figure 9:
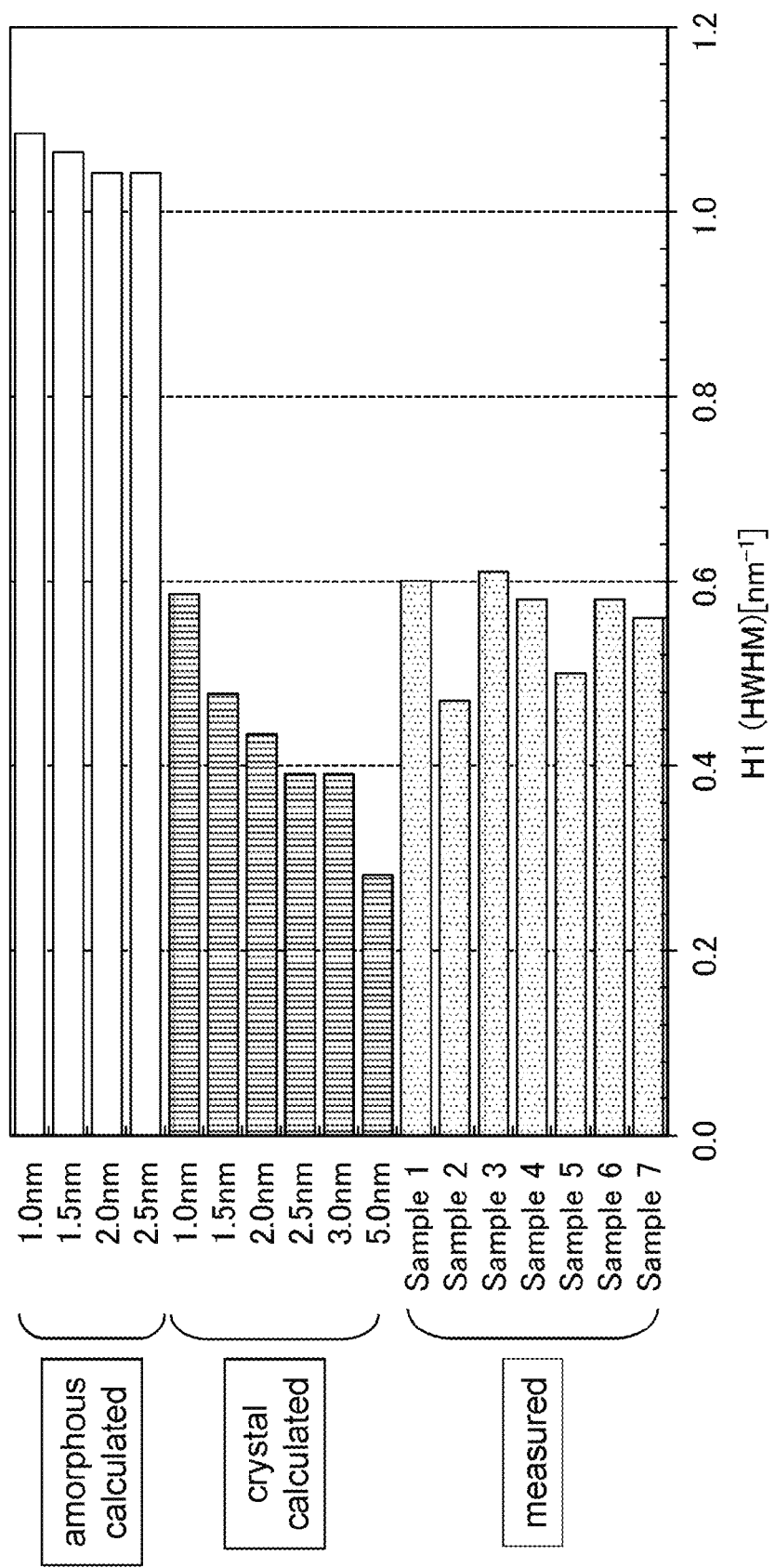
FIG. 9 shows half widths at half maximum of first peaks of electron diffraction luminance profiles.

According to FIG. 9, each calculation value of half widths at half maximum of the first peaks (H1) of amorphous $InGaZnO_4$ is approximately 1.0 $[\text{nm}^{-1}]$. In the case of amorphous $InGaZnO_4$, the half widths at half maximum of the first peaks (H1) were equivalent to each other regardless of the powder sizes.

According to FIG. 9, each calculation value of half widths at half maximum of the first peaks (H1) of crystalline $InGaZnO_4$ is about in a range of 0.3 $[\text{nm}^{-1}]$ to 0.6 $[\text{nm}^{-1}]$. In the case of crystalline $InGaZnO_4$, as the powder size is increased, the periodicity of atomic arrangement becomes high. Thus, the larger that powder size is, the narrower the half widths at half maximum of the first peaks (H1) are.

Further, according to FIG. 9, each actual measurement value of half widths at half maximum of the first peaks (H1) of nanocrystalline In—Ga—Zn oxides is about in a range of 0.4 $[\text{nm}^{-1}]$ to 0.6 $[\text{nm}^{-1}]$. Thus, it is found that the half width at half maximum of the first peak (H1) of nanocrystalline In—Ga—Zn oxide is narrower than that of the amorphous $InGaZnO_4$ and is almost equivalent to that of the crystalline $InGaZnO_4$.

Moreover, the half width at half maximum of the first peak (H1) was compared between the nanocrystalline In—Ga—Zn oxide and the crystalline $InGaZnO_4$. The comparison result indicated that the size of nanocrystal was about in a range from 1 nm to 3 nm.

This application is based on Japanese Patent Application serial no. 2013-056952 filed with Japan Patent Office on Mar. 19, 2013, the entire contents of which are hereby incorporated by reference.

What is claimed is:

1. An oxide semiconductor comprising:
    an aggregation of a plurality of crystals,
    wherein the plurality of crystals includes indium,
    wherein each of the plurality of crystals has a size larger than or equal to 1 nm and smaller than or equal to 3 nm, and
    wherein half widths at half maximum of a diffraction peak of the oxide semiconductor is 0.4 $\text{nm}^{-1}$ to 0.6 $\text{nm}^{-1}$.

2. The oxide semiconductor according to claim 1,
    wherein the plurality of crystals has no orientation, and
    wherein a boundary between the plurality of crystals is not observed in a TEM image of the oxide semiconductor.

3. The oxide semiconductor according to claim 1,
    wherein the plurality of crystals further includes gallium and zinc.

4. The oxide semiconductor according to claim 3,
    wherein the plurality of crystals is InGaZnO4 crystals.

5. The oxide semiconductor according to claim 1,
    wherein a diffraction pattern having a plurality of spots is observed when an electron diffraction measurement is performed on the oxide semiconductor by using an electron beam with a probe diameter larger than or equal to 1 nm and smaller than or equal to 30 nm, and
    wherein a diffraction pattern with no spot is observed when an electron diffraction measurement is performed on the oxide semiconductor by using an electron beam with a probe diameter larger than or equal to 300 nm.

6. The oxide semiconductor according to claim 5,
    wherein the plurality of spots is circularly arranged.

7. An oxide semiconductor comprising:
    indium,
    wherein a diffraction pattern having a plurality of spots circularly arranged is observed when an electron diffraction measurement is performed on the oxide semiconductor by using an electron beam with a probe diameter larger than or equal to 1 nm and smaller than or equal to 30 nm,
    wherein a diffraction pattern with no spot is observed when an electron diffraction measurement is performed on the oxide semiconductor by using an electron beam with a probe diameter larger than or equal to 300 nm, wherein a grain boundary is not observed in a TEM image of the oxide semiconductor, and wherein half widths at half maximum of a diffraction peak of the oxide semiconductor is 0.4 nm$^{-1}$ to 0.6 nm$^{-1}$.

8. The oxide semiconductor according to claim 7, further comprising gallium and zinc.

9. The oxide semiconductor according to claim 8, wherein the plurality of spots circularly arranged is derived from InGaZnO$_4$ crystals having no orientation.

* * * * *